US007719848B2

(12) United States Patent
Widmayer et al.

(10) Patent No.: US 7,719,848 B2
(45) Date of Patent: May 18, 2010

(54) BASE RADIOS WITH INTERCHANGEABLE MODULES

(75) Inventors: Robert B. Widmayer, Harvard, IL (US); James W. Turocy, Arlington Heights, IL (US); Peter P. Walter, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 1179 days.

(21) Appl. No.: 11/115,485

(22) Filed: Apr. 27, 2005

(65) Prior Publication Data
US 2006/0246952 A1 Nov. 2, 2006

(51) Int. Cl.
*H05K 5/00* (2006.01)
(52) U.S. Cl. ........................ 361/752; 361/800
(58) Field of Classification Search ................ 361/752, 361/790, 797, 800
See application file for complete search history.

(56) References Cited

U.S. PATENT DOCUMENTS

| 5,771,468 | A | 6/1998 | Stein | |
| 6,198,633 | B1* | 3/2001 | Lehman et al. | 361/756 |
| 6,747,878 | B1* | 6/2004 | Hipp et al. | 361/801 |
| 7,042,720 | B1* | 5/2006 | Konshak et al. | 361/687 |
| 2002/0196843 | A1* | 12/2002 | Ben-Bassat et al. | 375/219 |
| 2004/0130868 | A1* | 7/2004 | Schwartz et al. | 361/687 |
| 2004/0228090 | A1 | 11/2004 | Blackwell | |
| 2005/0024827 | A1 | 2/2005 | Espinoza-Ibarra | |

OTHER PUBLICATIONS

EIA Standard, Cabinets, Racks, Panels and Associated Equipment; EIA-310-D, Sep. 1992, Electronic Industries Association, Engineering Department.
PCT Search Report Dated Aug. 8, 2007.

* cited by examiner

*Primary Examiner*—Hung S Bui
(74) *Attorney, Agent, or Firm*—Valerie M. Davis

(57) ABSTRACT

Base radios and communication apparatus (100) that include: a chassis (110); at least one power supply module (120) having a height that is substantially the height of a three rack unit chassis and having a width that is substantially one sixth the usable width of a nineteen inch rack; at least one fan kit module (130) having a first fan kit module dimension that is substantially the height of the power supply module and a second fan kit module dimension that is substantially five sixths the usable width of a nineteen inch rack; and at least one other module (140, 150) having a first module dimension that is substantially the second fan kit module dimension and having a corresponding second module dimension.

13 Claims, 8 Drawing Sheets

BASE RADIOS WITH INTERCHANGEABLE MODULES

FIELD OF THE INVENTION

The present invention relates generally to base radios and related communication apparatus and more specifically to single base radios and multiple base radios having common interchangeable modules.

BACKGROUND OF THE INVENTION

The critical nature of the mechanical architecture of an infrastructure for mobile radio communication does not translate simply into mechanical direct material cost. Physical direct material cost (e.g., hardware, modules, housings, card cages) is typically a small percentage when compared to the electrical direct material cost (e.g., printed circuit board (PCB) components), and the electromechanical (mainly interconnect) direct material costs (e.g., connectors, interconnect boards, cables, shielding). The benefit of quality mechanical design is gained when the mechanical design enables significant cost savings to be realized in other areas of the design. Being able to streamline a PCB layout, to eliminate cables inside a module, to use standard connectors, to incorporate shielding into other mechanics, to streamline manufacturing processes, or reduce the size and number of layers required on a PCB, etc., creates the opportunities to save money.

For example, in base radio or base station design it is not unusual for designers to focus on a single base radio configuration mechanical design that would provide opportunities for concurrent improvements and cost savings in other parts of the base radio design. Alternatively, base radio designers might focus on a multiple base radio configuration mechanical design that would provide similar cost savings opportunities. However, typically the mechanical designs for the single base radio and the multiple base radio would use different components, such as the internal modules, power supplies and fan kits.

It would be advantageous, however, from a design and cost perspective if a single base radio configuration and a multiple base radio configuration, and related apparatus, could be designed that could use the same components, such as the internal modules, power supply and fan kit.

BRIEF DESCRIPTION OF THE FIGURES

A preferred embodiment of the invention is now described, by way of example only, with reference to the accompanying figures in which.

DETAILED DESCRIPTION OF THE INVENTION

Figure 1:
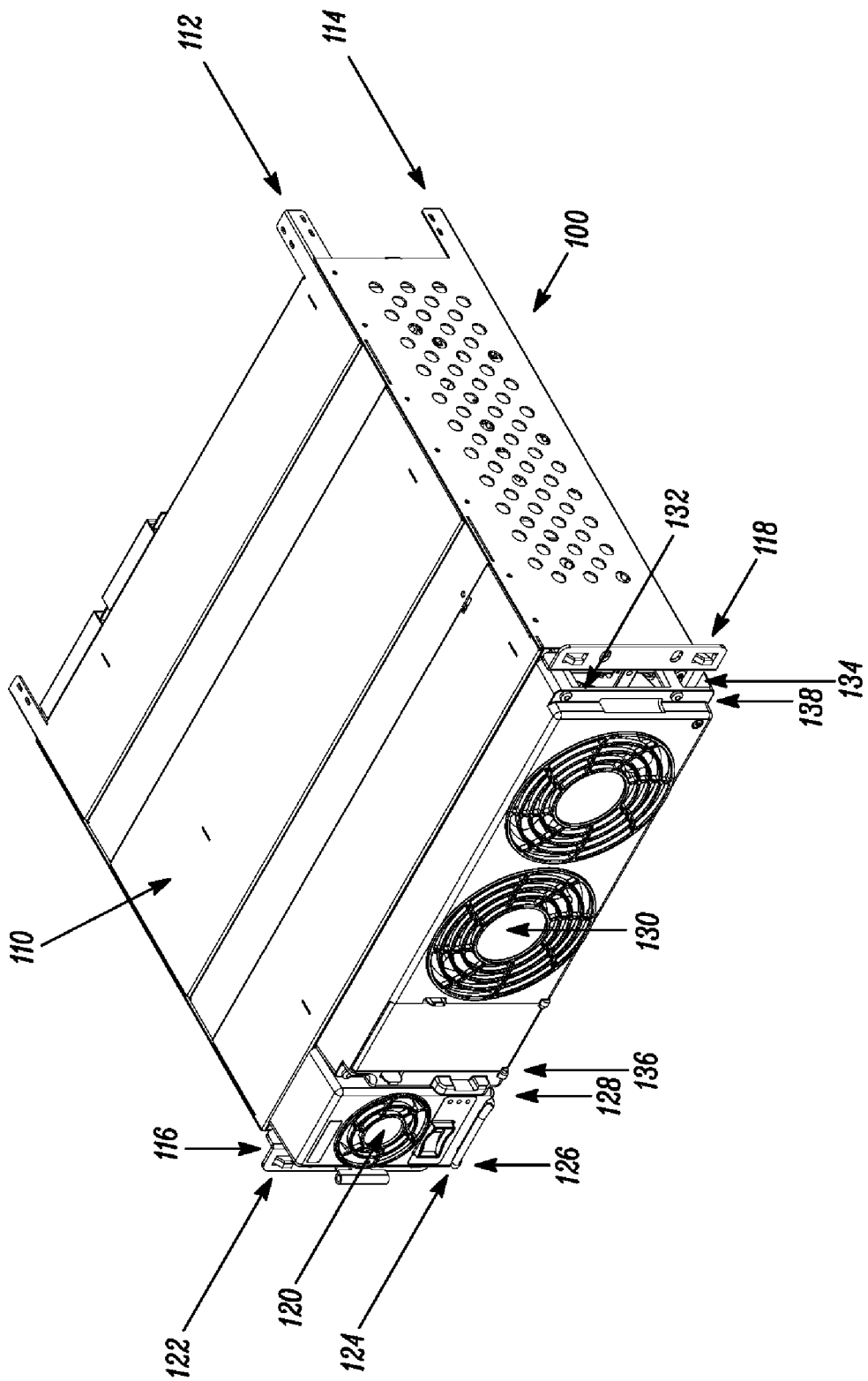
FIG. 1 illustrates a right front isometric view of a single base radio in accordance with embodiments of the present invention, with a fan kit covering the internal modules.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, common and well-understood elements that are useful or necessary in a commercially feasible embodiment may not be depicted in order to facilitate a less obstructed view of these various embodiments. For example, the various electromechanical, e.g., interconnect, and electrical material needed for a commercially feasible embodiment is typically not fully illustrated in the FIGS. 1-8 described herein. However, it should be readily understood by those of ordinary skill in the art that the embodiments illustrated in these figures also comprise suitable electrical material such as, for instance, PCB materials and suitable electromechanical material such as, for instance, connectors, cables, interconnect boards, and the like, for operatively coupling these elements together using, for example, means, manners and techniques that are well known in the art. Also, elements shown in the figures have not necessarily been drawn to scale. For example, the dimensions of some of the elements are exaggerated relative to each other. Further, where considered appropriate, reference numerals have been repeated among the figures to indicate corresponding elements.

Generally speaking, pursuant to the various embodiments, communication apparatus is described. For example, in accordance with various teachings of the present invention, the same field replaceable units (FRUs) also referred to herein as modules may be used for single base radio site configurations and multiple base radio site configurations such as, for instance, a six base radio site configuration (also referred to herein as a six-pack). In an exemplary embodiment, apparatus in accordance with the present invention comprises a common power supply module design, a common fan module (or fan kit) design, and at least two other modules that form the building blocks, so to speak, of various base radio configurations, both the single and multiple configurations. This apparatus enables: a reduction in the number of FRUs for a wide range of customer requirements; increased site integration allowing different bands of operation or functional configurations to fit in a common chassis; high availability based on efficient architectural design; and low cost of ownership. Those skilled in the art will realize that the above recognized advantages and other advantages described herein are merely exemplary and are not meant to be a complete rendering of all of the advantages of the various embodiments of the present invention.

Referring now to the drawings, and in particular FIG. 1, a right front isometric view of an exemplary single base radio in accordance with embodiments of the present invention is shown and indicated generally at 100. Those skilled in the art, however, will recognize and appreciate that the specifics of this illustrative example are not specifics of the invention itself and that the teachings set forth herein are applicable in a variety of alternative settings. For example, since the teachings described do not depend on the radio configuration or the communication apparatus being constructed, they can be applied to any type of communication apparatus although a single base radio for mobile radio communications is shown in this embodiment. As such, other alternative implementations of using different types of communications apparatus, such as cellular communications apparatus, are contemplated and are within the scope of the various teachings described.

Turning again to FIG. 1, base radio 100 comprises a three rack unit chassis 110, wherein a rack unit is a standard unit of height measurement for electronic equipment racks and is equivalent to one and three quarters inches or 44.45 millimeters, as defined in the Electronic Industries Association EIA-310-D standard (hereinafter referred to herein as "the EIA-310-D standard"). Chassis 110 may be manufactured using any suitable material such as a die cast metal, for example, and in this embodiment has a height from a top side 112 to a bottom side 114 of three rack units and a width (also referred to in the art as a panel opening) from a left side 116 to a right side 118 that is the width of a nineteen inch rack, as defined in the EIA-310-D standard. The chassis 110 also typically comprises a back plane (not shown) having, for example, various electromechanical interconnects for coupling to, between and/or together other elements of base radio 100.

Base radio 100 further includes a suitable exemplary power supply module 120 and a suitable exemplary fan module 130. In accordance with embodiments of the present invention, the power supply module 120 and the fan module 130 each are designed such that each may be used to construct a plurality of base radio and related apparatus configurations for a wide range of customer requirements, as is illustrated by reference to FIGS. 1-8. Base radio 100 further includes a power amplifier module and a transceiver module (not shown in FIG. 1) in accordance with embodiments of the present invention.

Power supply module 120 is typically designed with a portion internal to chassis 110 (not shown) that is slidably engaged with chassis 110 in any suitable manner. For example, this internal portion would typically be inserted into chassis 110 and have a portion that contacts the chassis either directly or via one or more suitable mounting elements. Power supply module 120 would further typically include suitable electromechanical interconnect, for example, for engaging and coupling the power supply to the back plane of chassis 110 and to other apparatus such as the other elements of base radio 100 and may also include additional electromechanical interconnect, such as cables for instance, for coupling the power supply to other apparatus such as the other elements of base radio 100.

Power supply module 120 is further typically designed with a portion that is external to chassis 110 that has a height from a top side 122 of the power supply module to a bottom side 124 of the power supply module that is substantially, taking into account any necessary clearances and tolerances, the height of chassis 110. For example, the height of the power supply module may be slightly smaller than the height of the chassis to account for clearance of the module if the chassis is inserted into a cabinet or other housing. Moreover, power supply 120 is typically designed with a width from a left side 126 to a right side 128 that is substantially, taking into account any necessary clearances and tolerances, one sixth the usable width (also referred to in the art as the usable aperture opening) of a nineteen inch (482.6 millimeters) rack, as defined by the EIA-310-D standard. Designing the width of power supply 120 in this manner facilitates the use of the same power supply design in the single base radio configuration, a multiple radio configuration and in other related communication apparatus as will be illustrated in more detail below by reference to the remaining figures.

Fan kit 130 is typically mounted or attached to chassis 110 using any suitable means or techniques such as, for instance, screwing the fan kit to the chassis either directly or via one or more suitable mounting elements. In this embodiment, fan kit 130 is typically designed with a first dimension from a first (e.g., top) side 132 to a second (e.g., bottom) side 134 that is substantially, taking into account any necessary clearances and tolerances, the height of the power supply, and with a second dimension from a third (e.g., left) side 136 to a fourth (e.g., right) side 138 that is substantially five sixths the usable width of a nineteen inch rack. In this embodiment of the single base radio configuration 100, the first dimension is the height of the fan kit 130, and the second dimension is the width of the fan kit 130. Designing the dimensions of the fan kit in this manner facilitates the use of the same fan kit design in the single base radio configuration, a multiple base radio configuration and in other related communication apparatus. Moreover, the dimensions of the fan kit are typically designed to completely cover one or more internal modules that may be inserted into a chassis behind the fan kit, to facilitate efficient flow of ambient air, for example, over the one or more modules for cooling the module(s).

Figure 2:
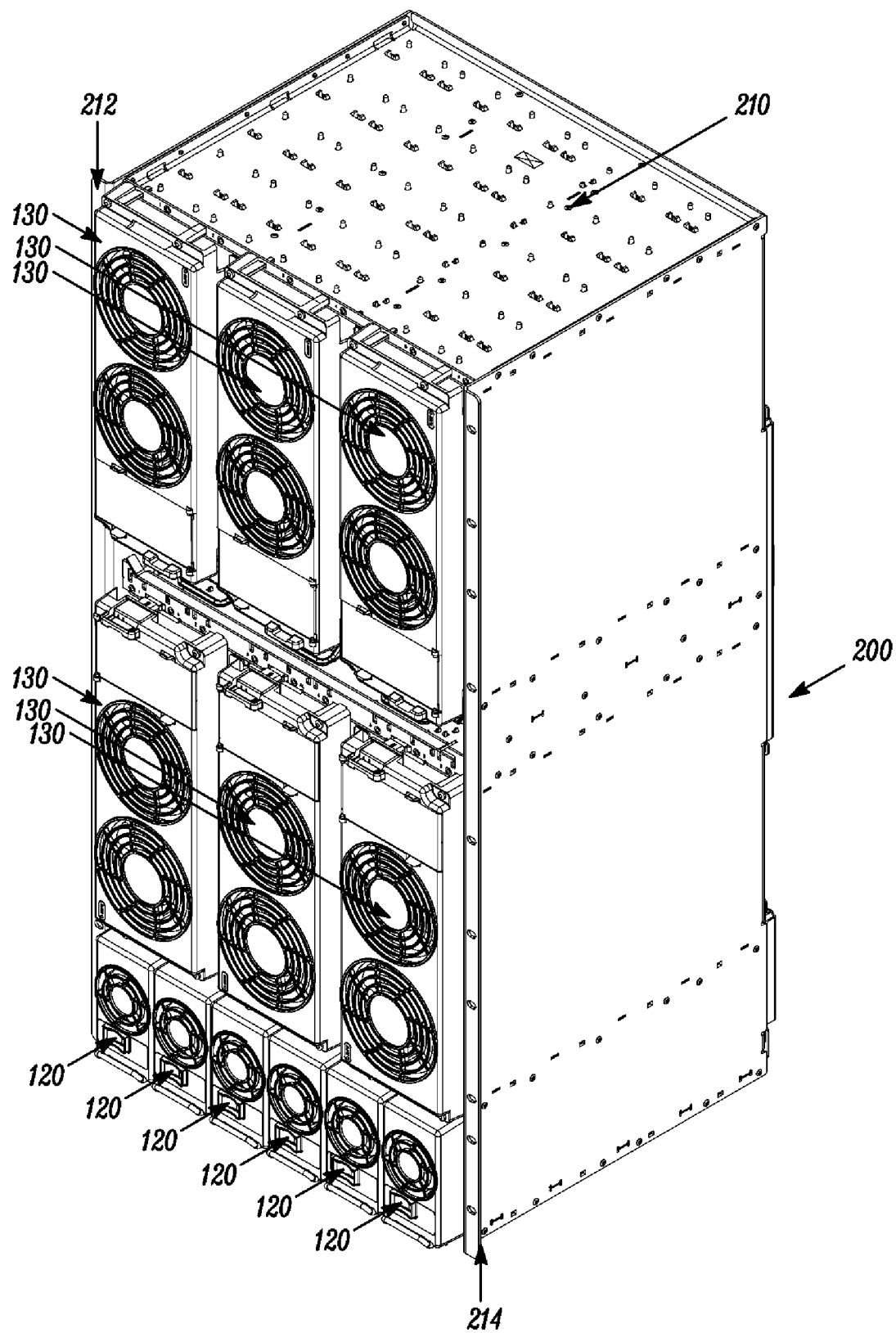
FIG. 2 illustrates a right front isometric view of an exemplary multiple base radio in accordance with embodiments of the present invention, with fan kits covering the internal modules.

Turning now to FIG. 2, a right front isometric view of an exemplary multiple base radio in accordance with embodiments of the present invention is shown and generally indicated at 200, where a multiple base radio or multiple radio is defined as a base radio configuration that is designed to simultaneously support multiple radios. The multiple radio configuration shown therein is a six radio configuration also referred to herein as a "six-pack" and is designed to simultaneously support up to six radios. However, those skilled in the art will realize that the teachings of the present invention are not limited to the six-pack multiple base radio configuration but are equally applicable to any multiple base radio configuration. Returning again to FIG. 2, six-pack 200 comprises a chassis 210 that has a width from a left side 212 to a right side 214 that is equivalent to the width of a nineteen inch rack. The chassis 210 also typically comprises a back plane (not shown) having, for example, various electromechanical interconnects for coupling to, between and/or together other elements of base radio 100.

Six-pack 200 typically further comprises six power supply modules 120 that are each designed the same as and attached to the chassis 210 and/or coupled to other apparatus such as the other elements of the six-pack 200 using, for instance, manners and techniques similar to that of the power supply module that comprises the single base radio configuration 100, and is correspondingly identically labeled. Pursuant to an efficient mechanical design of power supply 120, the total of the widths of the power supply modules 120 is substantially the usable width of chassis 210. Six-pack 200 also typically comprises six fan modules 130 that are each designed the same as and attached to the chassis 210 using, for instance, manners and techniques similar to that of the fan module that comprises the single base radio configuration 100 and is correspondingly identically labeled. Similarly, an efficient mechanical design of fan kit 130 enables the same fan kit to be used in both the single base radio configuration and a multiple base radio configuration such as the six-pack. In this embodiment, the six fan kits are arranged such that they are oriented ninety degrees with respect to the fan kit orientation of the fan kit comprising base radio 100. Such an orientation facilitates significant cost savings with respect to electromechanical direct material costs, for example, by enabling the reduction of various cables, connectors, interconnect boards, etc. (not shown) but that would typically be located at the rear of the chassis 210.

Finally, six-pack 200 comprises a plurality of other modules (not shown) that are inserted into the chassis 210 behind each of the six fan kits 130. These other modules are typically also designed in accordance with the present teachings. It should be further noted, that in the orientation of the fan kits in the six-pack configuration, the efficient design of these fan kits enables each fan kit to completely cover the one or more internal modules that are inserted into chassis 210 behind the fan kit to facilitate efficient flow of ambient air, for example, over the one or more modules for cooling the module(s).

The internal modules of the various base radio configurations as described above by reference to FIGS. 1 and 2 are also designed in accordance with the teachings of the present invention so that a minimum number of module sizes are needed. In one embodiment, there are three different module sizes that may comprise the internal modules of the single base radio configuration, multiple radio configurations and related radio apparatus. These module sizes will be referred to herein for simplicity as a "large" module, a "medium" module and a "small" module because of their relative dimensions. Each module is manufactured using a suitable material such as a die cast metal and is typically slidably engaged with a chassis in any suitable manner. For example, the module would typically be inserted into a chassis such that a portion of the module contacts the chassis either directly or via one or more suitable mounting elements. Each module would further typically include suitable electrical material such as PCB boards and suitable electromechanical interconnect, for example, for engaging and coupling the module to the back plane of the chassis and to other apparatus and may also include additional electromechanical interconnect such as cables, for instance, for coupling the module to other apparatus.

In one embodiment, the large module has a first dimension (that may be the height or width depending of its orientation) that is substantially, taking into account any necessary clearances and tolerances, the width of the fan kit in the single base radio orientation or that is substantially five sixths the usable width of a nineteen inch rack. The large module further has a second dimension that is substantially, taking into account any necessary clearances and tolerances, one half the height of the fan kit in the single base radio orientation. These exemplary dimensions of the large module enable, for example, two large modules to be covered by a fan kit in the six-pack orientation for a more efficient design having minimum unused space therein for maximum mechanical design efficiency and a corresponding cost savings due in part to interconnect cost savings.

In this embodiment, the small module typically has the same first dimension as the large module and a corresponding second dimension that is substantially, taking into account any necessary clearances and tolerances, one third the usable height of a three rack unit chassis. These exemplary dimensions of the small module enable, for example, three small modules to be covered by a fan kit in a site controller apparatus design as described herein and to enable a six-pack configuration to be designed in accordance with these teachings having minimum unused space therein for maximum mechanical design efficiency.

In this embodiment, the medium module also typically has the same first dimension as the large module and has a corresponding second dimension that is designed having a suitable size that is between that of the second dimensions of the large and small modules. However, it should also be realized that in another embodiment there may be only the large and small module designs for constructing communication apparatus, such as that described herein, without departing from the present teachings.

Figure 3:
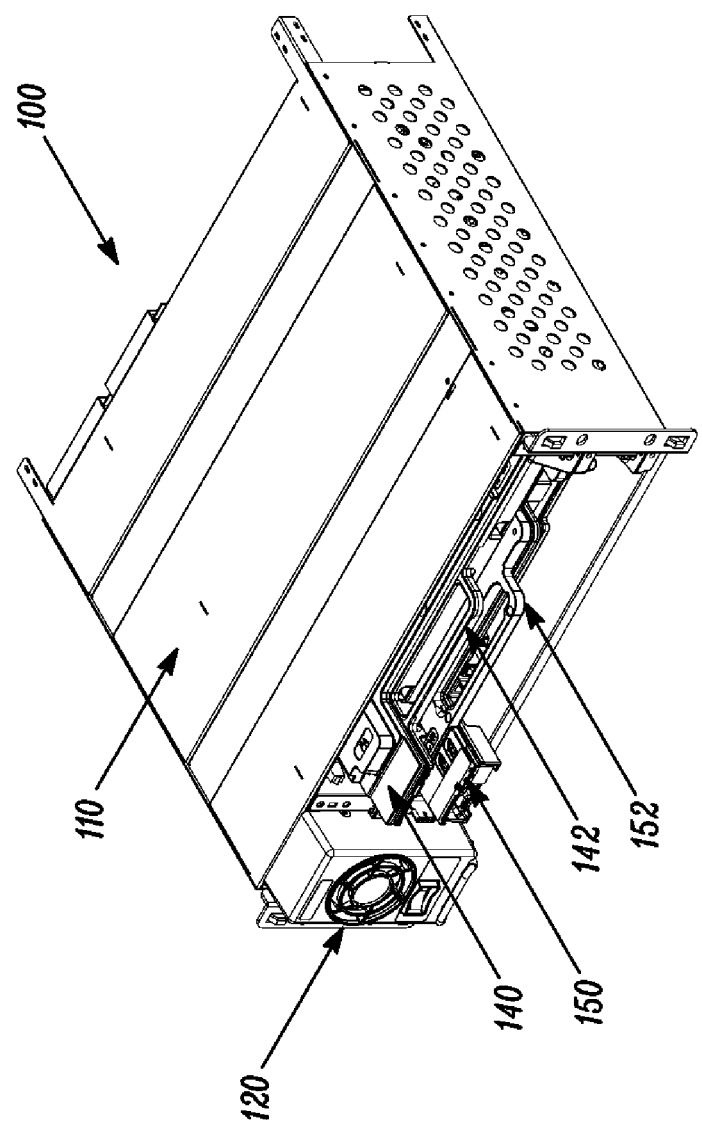
FIG. 3 illustrates a right front isometric view of the single base radio of FIG. 1, showing the internal modules.

We now turn to a description of how the small, medium and large modules can be used to comprise various base radio configurations and related communication apparatus in accordance with embodiments of the present invention. Turning now to FIG. 3, a right front isometric view of the single base radio of FIG. 1, showing the internal modules, is shown and generally indicated at 100. As described above, base radio 100 comprises a chassis 110, a power supply 120 and a fan kit (not shown). This exemplary base radio configuration further comprises a large module 140 configured with suitable hardware and software for performing as a power amplifier, the functionality of which is well known in the art and a medium module 150 configured with suitable hardware and software for performing as a transceiver, the functionality of which is also well known in the art. Both modules 140 and 150 my also be designed with front handles 142 and 152, respectively, to assist in sliding the modules in and out of chassis 110.

Figure 4:
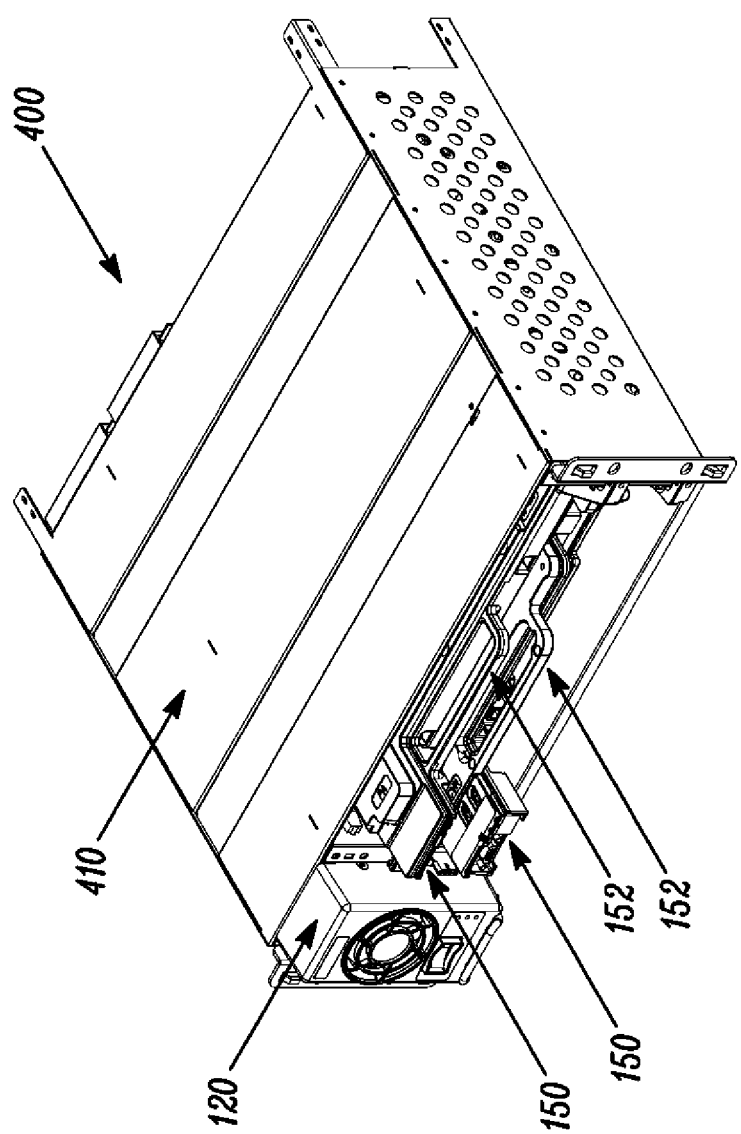
FIG. 4 illustrates a right front isometric view of a satellite receiver in accordance with embodiments of the present invention, showing the internal modules.

Turning now to FIG. 4, a right front isometric view of a satellite receiver in accordance with embodiments of the present invention, showing the internal modules, is shown and generally indicated at 400. This exemplary communication apparatus comprises a three rack unit chassis 410 that is typically similar to the chassis comprising base radio 100, a power supply 120 that is designed the same as and attached to the chassis 410 and/or coupled to other apparatus such as the other elements of the satellite receiver 400 using, for instance, manners and techniques similar to that of the power supply comprising base radio 100, and correspondingly identically labeled, and a fan kit (not shown) that is designed the same as and attached to the chassis 410 using, for instance, manners and techniques similar to that of the fan kit comprising base radio 100. Satellite receiver 400 further comprises two medium modules 150 that are each configured with suitable hardware and software for performing as a transceiver, the functionality of which is well known in the art. Modules 150 may also be designed with front handles 152 to assist in sliding the modules in and out of chassis 410.

Figure 5:
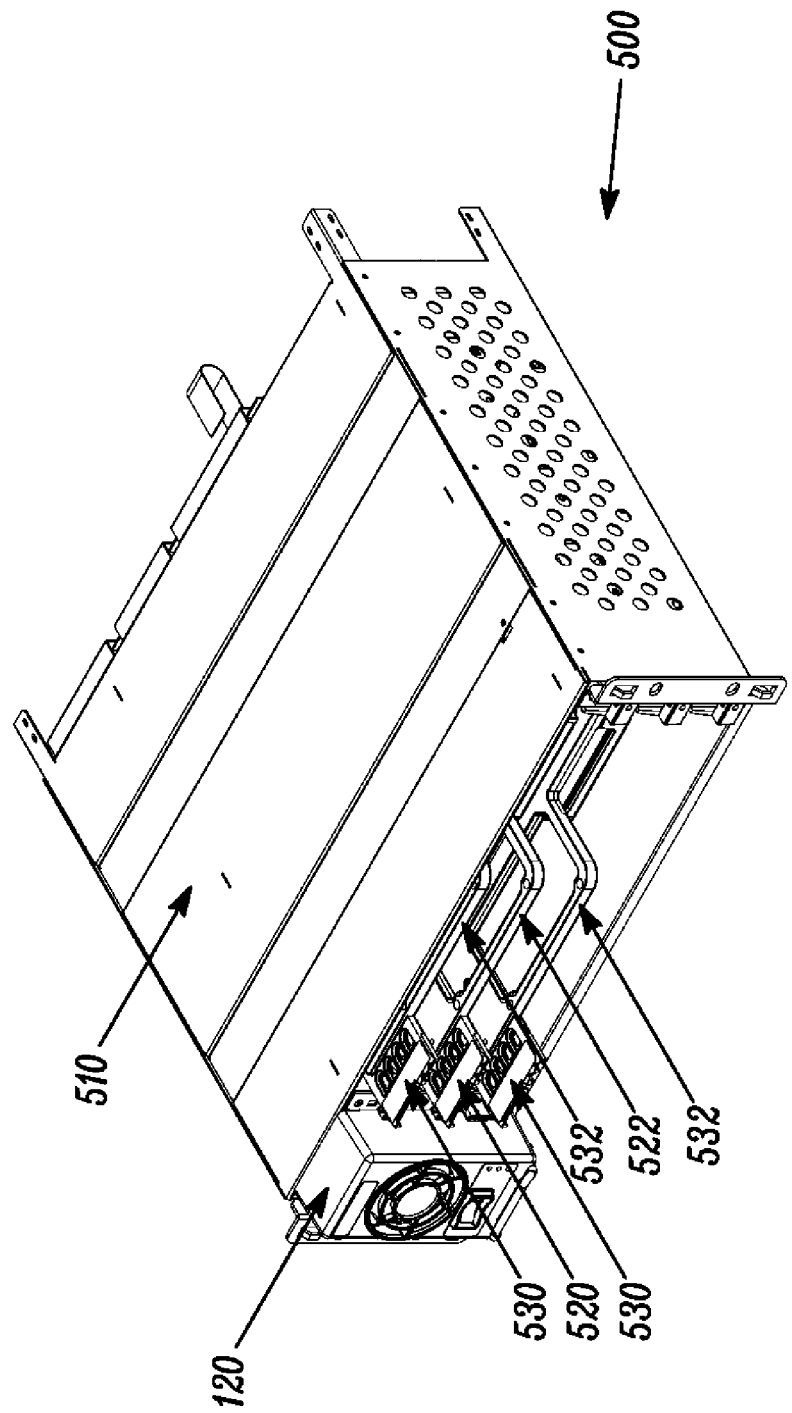
FIG. 5 illustrates a right front isometric view of a site controller in accordance with embodiments of the present invention, showing the internal modules.

Turning now to FIG. 5, a right front isometric view of a site controller in accordance with embodiments of the present invention, showing the internal modules, is shown and generally indicated at 500. This exemplary communication apparatus comprises a three rack unit chassis 510 that is typically similar to the chassis comprising base radio 100, a power supply 120 that is designed the same as and attached to the chassis 510 and/or coupled to other apparatus such as the other elements of the site controller 500 using, for instance, manners and techniques similar to that of the power supply comprising base radio 100 and correspondingly identically labeled, and a fan kit (not shown) that is designed the same as and attached to the chassis 510 using, for instance, manners and techniques similar to that of the fan kit comprising base radio 100. Site controller 500 further comprises three small modules 520 and 530. The two small modules 530 are each configured with suitable hardware and software for performing as a site controller, the functionality of which is well known in the art. The small module 520 is configured with suitable hardware and software for performing as an alarm, the functionality of which is well known in the art. Modules 520 and 530 may also be designed with front handles 522 and 532 respectively to assist in sliding the modules in and out of chassis 510.

In another embodiment, at least one module comprising a base radio configuration or other communication apparatus includes a keying mechanism or device in accordance with embodiments of the present invention. For example, one or all of the modules 520 and 530 may include such a keying device. The keying device prevents modules from being placed in the wrong location in a chassis, which helps to minimize damage to the module and/or the apparatus that the module comprises. The keying mechanism, depending on the design, may also enable the module to be readily identified by simply looking at the device.

Figure 6:
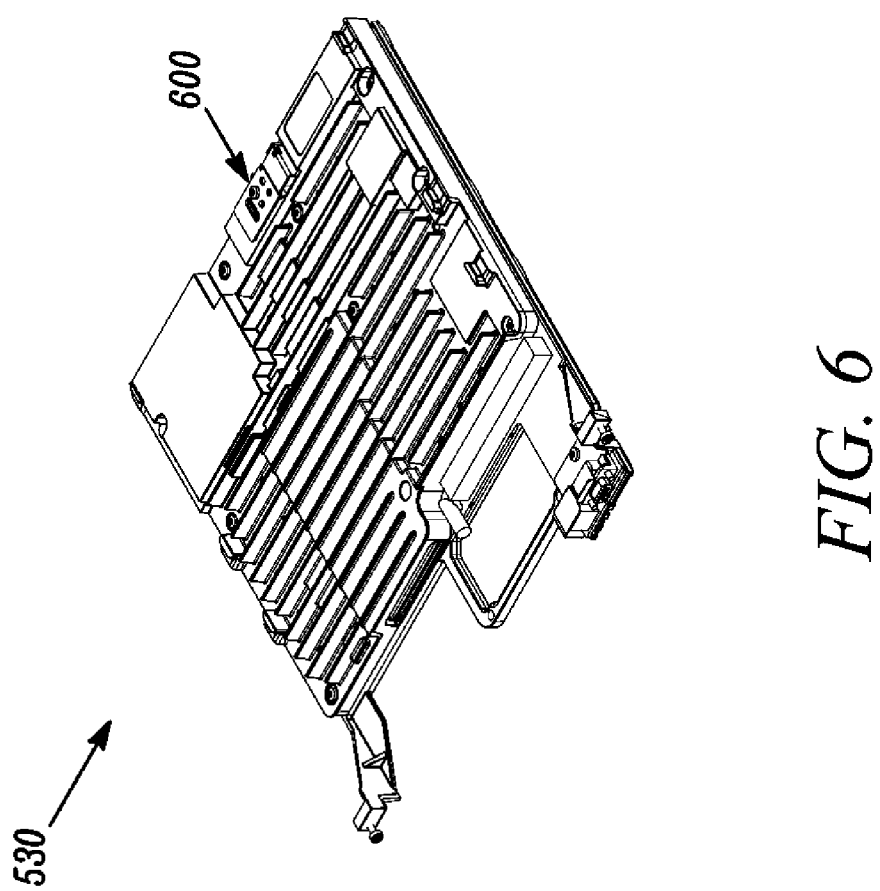
FIG. 6 illustrates a right front isometric view of a module having a keying mechanism in accordance with embodiments of the present invention.

Turning now to FIG. 6, a right front isometric view of a site controller module having a keying mechanism in accordance with embodiments of the present invention is shown and generally indicated at 530. Site controller 530 is one of the site controller modules 530 that comprises apparatus 500 of FIG. 5. It should be noted that site controller 530 is oriented 180 degrees in FIG. 6 with respect to its orientation in FIG. 5 so as to illustrate a keying device 600 included on the module.

Figure 7:
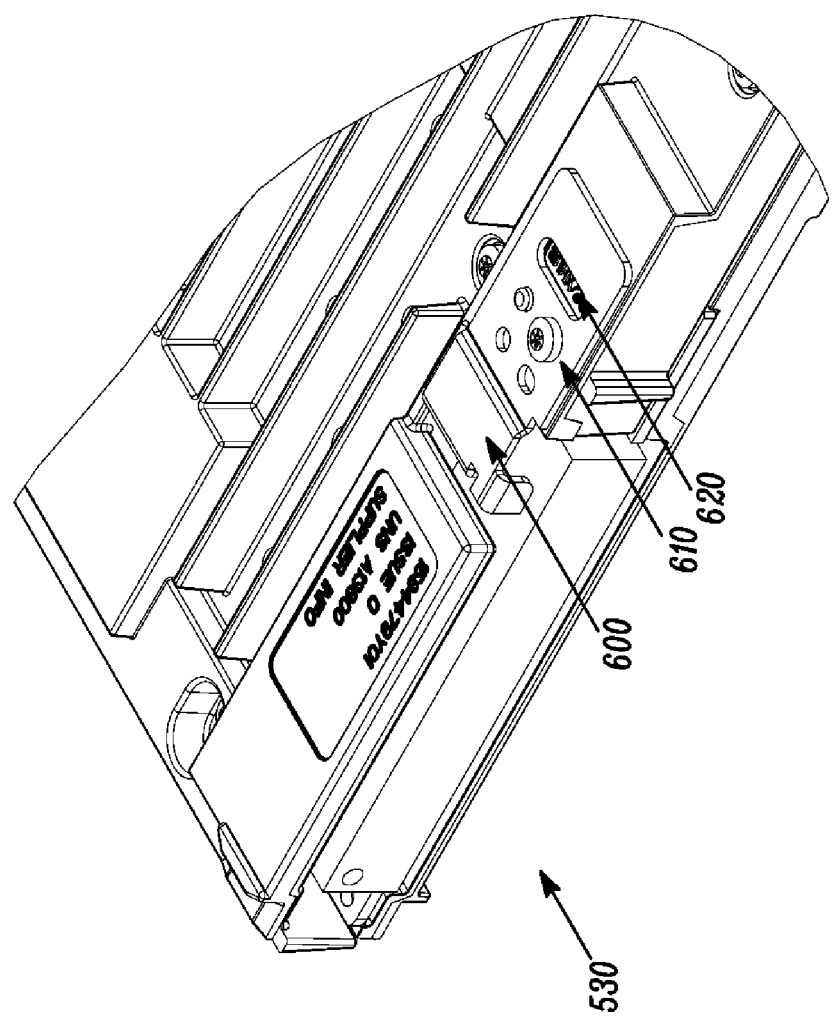
FIG. 7 illustrates an enlarged view of the keying mechanism of FIG. 6.

FIG. 7 illustrates an enlarged view of the keying device 600 included on module 530. In this embodiment, keying device 600 comprises a plate having voids to accept all possible keying pin locations inherent to that module. The keying pins (not shown) typically extend perpendicular from the back of the module to minimize a hazardous environment caused by exposed pins. The keying device may then be adjusted to a particular keying pin location and then secured in any suitable manner, such as by using a screw (e.g., 610). In this secured position, the keying device enables insertion of the module in the chassis for that particular keying pin location and blocks the module from being inserted into other areas of the chassis that correspond to different keying pin locations. In this embodiment, the module illustrated in FIG. 7 can be a single module design having a keying device according to embodiments of the present invention that can be implemented as either a module 530 (shown) or a module 520 (of FIG. 5) depending upon in which position the keying device is secured.

Keying device 600 may also comprise an opening, e.g., 620, through which a module name corresponding to the particular keying pin location can be displayed. This would enable a visual identification to further minimize improper insertion of the module into a chassis.

Figure 8:
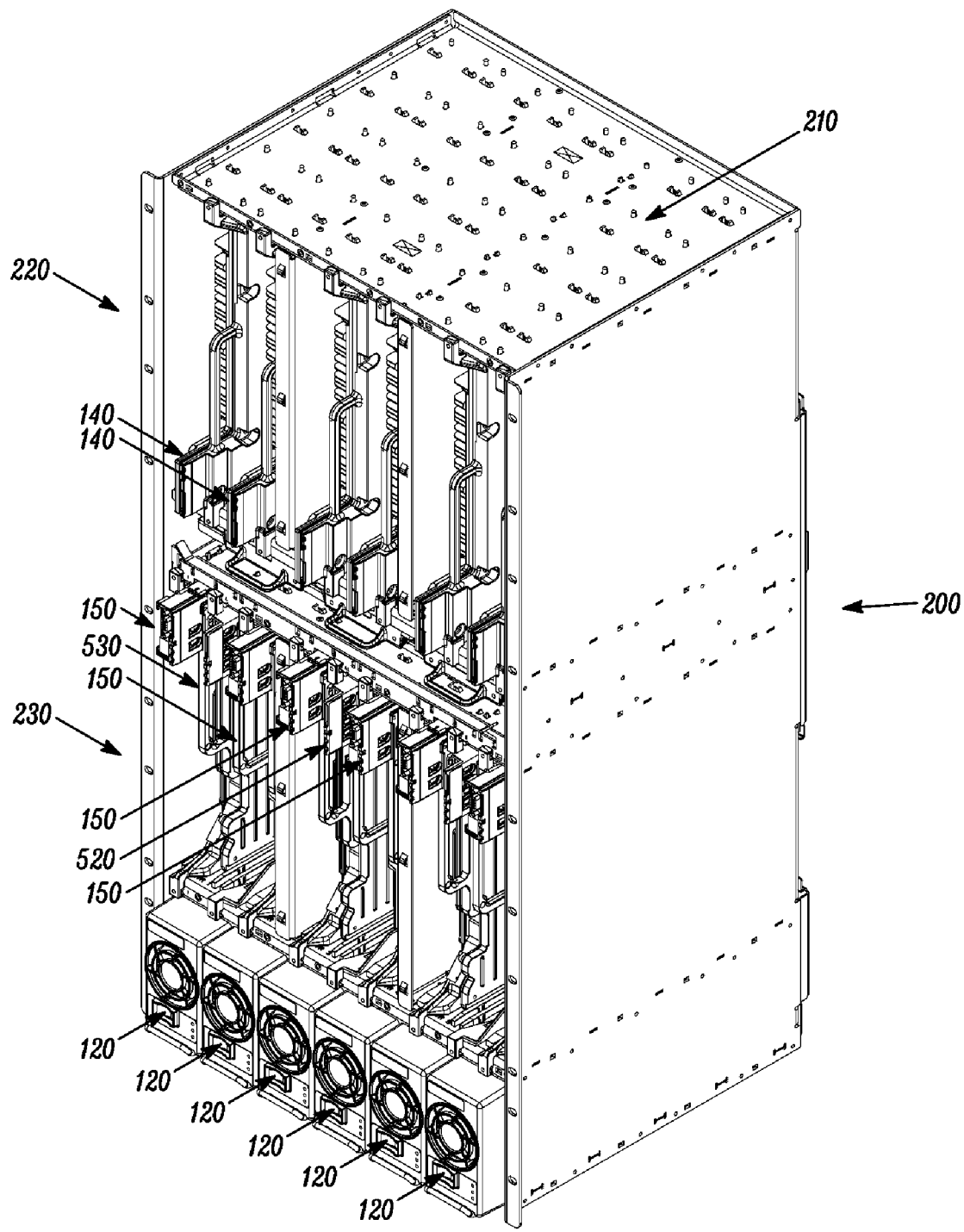
FIG. 8 illustrates a right front isometric view of the multiple base radio of FIG. 2, showing the internal modules.

Turning now to FIG. 8, a right front isometric view of the multiple base radio of FIG. 2, showing the internal modules, in accordance with embodiments of the present invention is shown and generally indicated at 200. As described above, six-pack 200 comprises a chassis 210, six power supply modules 120 and six fan kits (not shown). This exemplary six-pack radio configuration further comprises two rows 220, 230 of slots for accepting modules, each row having three slots. Each slot is at least partially covered by a fan kit (not shown), and included in each slot is one or more modules. In this embodiment, each slot in the top row 220 includes two large modules 140 configured with suitable hardware and software for performing as a power amplifier, the functionality of which is well known in the art. Each slot in the next row 230 includes two medium modules 150 configured with suitable hardware and software for performing as a transceiver, the functionality of which is also well known in the art and one small module 520, 530 configured with suitable hardware and software for performing the functionality of a site controller or an alarm. In this embodiment, the center slot includes a module 520 and the two outside slots include a module 530. All of the modules comprising six-pack 200 may be designed with a front handle to assist in sliding the modules in and out of chassis 210.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

What is claimed is:

1. Apparatus comprising:
   a chassis;
   at least one power supply module having a height that is substantially the height of a three rack unit chassis and having a width that is substantially one sixth the usable width of a nineteen inch rack;
   at least one fan kit module having a first fan kit module dimension that is substantially the height of the power supply module and a second fan kit module dimension that is substantially five sixths the usable width of a nineteen inch rack; and
   at least one other module selected from the group comprising:
      a first module having a first module dimension that is substantially the second fan kit module dimension and having a corresponding second module dimension that is substantially one half the first fan kit module dimension; and
      a second module having the first module dimension and having a corresponding second module dimension that is substantially one third the usable height of a three rack unit chassis, wherein the at least one power supply module, the at least one fan kit module and the at least one other module are operatively coupled together, the at least one power supply module and the at least one other module are slidably engaged with the chassis, and the fan kit module is operatively attached to the chassis.

2. The apparatus of claim 1, wherein the group further comprises a third module having the first module dimension and having a corresponding second module dimension that is smaller than the second module dimension of the first module and larger than the second module dimension of the second module.

3. The apparatus of claim 2, wherein the third module comprises a transceiver.

4. The apparatus of claim 2, wherein the apparatus comprises a satellite receiver, which comprises two third modules.

5. The apparatus of claim 1, wherein the first module comprises a power amplifier and the second module comprises one of a site controller and an alarm.

6. The apparatus of claim 1, wherein the apparatus comprises a base radio configuration.

7. The apparatus of claim 6, wherein the base radio configuration comprises a single base radio configuration comprising a first module and a third module having the first module dimension and having a corresponding second module dimension that is smaller than the second module dimension of the first module and larger than the second module dimension of the second module.

8. The apparatus of claim 6, wherein the base radio configuration comprises a multiple radio configuration.

9. The apparatus of claim 8, wherein the multiple radio configuration comprises a six radio configuration, which comprises six first modules, three second modules and six third modules, each third module having the first module dimension and having a corresponding second module dimension that is smaller than the second module dimension of the first module and larger than the second module dimension of the second module, wherein the chassis comprises a first row that comprises three slots for receiving two of the first modules into each slot, and a second row that comprises three slots for receiving one of the second modules and two of the third modules into each slot.

10. The apparatus of claim 1, wherein the apparatus comprises a site controller, which comprises three second modules.

11. The apparatus of claim 1 further comprising a keying device operatively coupled thereto.

12. The apparatus of claim 11, wherein at least one of the other modules selected from the group comprises the keying device.

13. The apparatus of claim 12, wherein the keying device comprises an opening for enabling a visual identification of the module comprising and implementing the keying device.

* * * * *